US008826607B2

(12) United States Patent
Shiao et al.

(10) Patent No.: US 8,826,607 B2
(45) Date of Patent: Sep. 9, 2014

(54) PHOTOVOLTAIC ROOFING ELEMENTS AND ROOFS USING THEM

(71) Applicants: Ming-Liang Shiao, Collegeville, PA (US); Gregory F. Jacobs, Oreland, PA (US)

(72) Inventors: Ming-Liang Shiao, Collegeville, PA (US); Gregory F. Jacobs, Oreland, PA (US)

(73) Assignee: CertainTeed Corporation, Valley Forge, PA (US)

( * ) Notice: Subject to any disclaimer, the term of this patent is extended or adjusted under 35 U.S.C. 154(b) by 0 days.

(21) Appl. No.: 13/716,884

(22) Filed: Dec. 17, 2012

(65) Prior Publication Data

US 2013/0098446 A1 Apr. 25, 2013

Related U.S. Application Data

(63) Continuation of application No. 12/267,458, filed on Nov. 7, 2008, now Pat. No. 8,333,040.

(60) Provisional application No. 60/986,224, filed on Nov. 7, 2007.

(51) Int. Cl.
*E04D 13/18* (2014.01)
*E04H 14/00* (2006.01)
*H01L 31/048* (2014.01)
*E04D 13/00* (2006.01)

(52) U.S. Cl.
CPC ............. *H01L 31/0483* (2013.01); *Y02B 10/12* (2013.01); *Y02E 10/50* (2013.01); *H01L 31/048* (2013.01); *E04D 13/00* (2013.01)
USPC ............................ 52/173.3; 52/311.1; 52/314

(58) Field of Classification Search
USPC ........ 52/173.3, 2.11, 83, 311.1, 314; 136/251
See application file for complete search history.

(56) References Cited

U.S. PATENT DOCUMENTS

| 4,235,643 | A | * | 11/1980 | Amick | ........................... 136/246 |
|---|---|---|---|---|---|
| 5,203,941 | A | | 4/1993 | Spain et al. | |
| 5,273,608 | A | | 12/1993 | Nath | |
| 5,284,693 | A | | 2/1994 | Spain et al. | |
| 5,303,525 | A | | 4/1994 | Magee | |
| 5,421,909 | A | | 6/1995 | Ishikawa et al. | |
| 5,468,532 | A | | 11/1995 | Ho et al. | |

(Continued)

FOREIGN PATENT DOCUMENTS

| DE | 20214872 | 2/2003 |
|---|---|---|
| JP | 2000-188411 | 4/2000 |

(Continued)

OTHER PUBLICATIONS

International Search Report and Written Opinion for PCT/US2008/082896 dated Nov. 2, 2009.

*Primary Examiner* — William Gilbert
*Assistant Examiner* — Patrick Maestri
(74) *Attorney, Agent, or Firm* — McDonnell Boehnen Hulbert & Berghoff LLP

(57) ABSTRACT

The present invention relates generally to photovoltaic devices, and more particularly to photovoltaic roofing products in which a photovoltaic element is joined to a roofing substrate. In one embodiment, the present invention provides a photovoltaic roofing element comprising a roofing substrate; one or more photovoltaic cells disposed on the roofing substrate; and a colored or patterned layer disposed on the roofing substrate and visible in the area surrounding the photovoltaic cells; and an encapsulant layer disposed over the photovoltaic cells and the patterned colored layer.

22 Claims, 5 Drawing Sheets

(56) References Cited

U.S. PATENT DOCUMENTS

| | | | |
|---|---|---|---|
| 5,506,031 A | 4/1996 | Spain et al. | |
| 5,575,861 A * | 11/1996 | Younan et al. | 136/251 |
| 5,662,977 A | 9/1997 | Spain et al. | |
| 5,680,734 A | 10/1997 | Magee | |
| 5,807,440 A | 9/1998 | Kubota et al. | |
| 5,882,774 A | 3/1999 | Jonza et al. | |
| 5,953,877 A | 9/1999 | Kalkanoglu et al. | |
| 5,990,414 A | 11/1999 | Posnansky | |
| 6,049,035 A | 4/2000 | Tsuri et al. | |
| 6,180,228 B1 | 1/2001 | Mueller et al. | |
| 6,232,544 B1 | 5/2001 | Takabayashi | |
| 6,237,288 B1 | 5/2001 | Jenkins et al. | |
| 6,268,558 B1 | 7/2001 | Kubota | |
| 6,296,732 B1 | 10/2001 | Enlow et al. | |
| 6,329,046 B1 | 12/2001 | Merrill et al. | |
| 6,355,132 B1 | 3/2002 | Becker et al. | |
| 6,451,414 B1 | 9/2002 | Wheatley et al. | |
| 6,455,140 B1 | 9/2002 | Whitney et al. | |
| 6,459,514 B2 | 10/2002 | Jonza et al. | |
| 6,467,235 B2 | 10/2002 | Kalkanoglu et al. | |
| 6,521,038 B2 | 2/2003 | Yanagimoto et al. | |
| 6,523,316 B2 | 2/2003 | Stahl et al. | |
| 6,538,192 B1 | 3/2003 | Coster et al. | |
| 6,565,982 B1 | 5/2003 | Ouderkirk et al. | |
| 6,574,045 B2 | 6/2003 | Hebrink et al. | |
| 6,590,705 B1 | 7/2003 | Allen et al. | |
| 6,590,707 B1 | 7/2003 | Weber | |
| 6,609,795 B2 | 8/2003 | Weber et al. | |
| 6,679,308 B2 | 1/2004 | Becker et al. | |
| 6,715,252 B2 | 4/2004 | Stahl et al. | |
| 6,753,065 B2 | 6/2004 | Okuyama | |
| 7,118,794 B2 | 10/2006 | Kalkanoglu et al. | |
| 7,138,173 B2 | 11/2006 | Wheatley et al. | |
| 7,227,078 B2 | 6/2007 | Jongerden et al. | |
| 8,209,920 B2 | 7/2012 | Krause et al. | |
| 8,333,040 B2 | 12/2012 | Shiao et al. | |
| 2003/0178058 A1 | 9/2003 | Jongerden et al. | |
| 2004/0031518 A1 | 2/2004 | Plantfeber | |
| 2006/0266406 A1 | 11/2006 | Faust et al. | |
| 2007/0054129 A1 * | 3/2007 | Kalkanoglu et al. | 428/413 |
| 2007/0056625 A1 | 3/2007 | Higuchi et al. | |
| 2007/0059493 A1 | 3/2007 | Okuyama | |
| 2007/0146624 A1 * | 6/2007 | Duston et al. | 349/193 |
| 2007/0153354 A1 | 7/2007 | Duston et al. | |
| 2008/0006323 A1 | 1/2008 | Kalkanoglu et al. | |
| 2008/0102270 A1 | 5/2008 | Shiao et al. | |
| 2008/0178928 A1 | 7/2008 | Warfield et al. | |
| 2008/0271773 A1 | 11/2008 | Jacobs et al. | |
| 2009/0000221 A1 | 1/2009 | Jacobs et al. | |
| 2009/0000222 A1 | 1/2009 | Kalkanoglu et al. | |
| 2009/0133340 A1 | 5/2009 | Shiao | |
| 2009/0133738 A1 | 5/2009 | Shiao | |

FOREIGN PATENT DOCUMENTS

| | | |
|---|---|---|
| WO | 2006121433 | 11/2006 |
| WO | 2007064322 | 7/2007 |
| WO | 2008052029 | 5/2008 |

* cited by examiner

PHOTOVOLTAIC ROOFING ELEMENTS AND ROOFS USING THEM

CROSS-REFERENCE TO RELATED APPLICATIONS

This application is a continuation under 35 U.S.C. §120 of U.S. patent application Ser. No. 12/267,458, filed Nov. 7, 2008, which claims priority under 35 U.S.C. §119(e) to U.S. Provisional Patent Application Ser. No. 60/986,224, filed Nov. 7, 2007, each of which is hereby incorporated herein by reference in its entirety.

BACKGROUND OF THE INVENTION

1. Field of the Invention

The present invention relates generally to photovoltaic devices. The present invention relates more particularly to photovoltaic roofing products in which a photovoltaic element is joined to a roofing substrate.

2. Summary of the Related Art

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as device performance has improved. They can be used to provide at least a significant fraction of the electrical energy needed for a building's overall function; or they can be used to power one or more particular devices, such as exterior lighting systems.

Existing photovoltaic modules do not blend well aesthetically with conventional roofing materials. Photovoltaic materials tend to have a deep blue/purple/black color, which lends them increased solar absorptivity and therefore increased efficiency. Standard asphalt composite shingles, for example, are generally grey, black, green or brown in tone. Stone, wood and ceramic materials also have appearances quite different from that of photovoltaic materials. Moreover, many synthetic roofing materials (e.g., plastic tiles, shakes, slates and panels) are fabricated to appear like a more traditional material (e.g., stone, ceramic or wood). Accordingly, the contrast between photovoltaic materials and standard roofing materials can be quite dramatic.

SUMMARY OF THE INVENTION

One aspect of the invention is a photovoltaic roofing element comprising a roofing substrate; one or more photovoltaic cells disposed on the roofing substrate; and a colored or patterned layer disposed on the roofing substrate and visible in the area surrounding the photovoltaic cells; and an encapsulant layer disposed over the photovoltaic cells and the patterned colored layer.

Another aspect of the present invention is a photovoltaic roofing system disposed on a roof deck, the photovoltaic roofing system comprising a plurality of non-photovoltaic roofing elements; and a plurality of photovoltaic roofing elements as described above, the colored or patterned layers of the photovoltaic roofing elements being patterned and/or colored to resemble the non-photovoltaic roofing elements.

The photovoltaic roofing elements and roofs of the present invention can result in a number of advantages over prior art methods. For example, the photovoltaic roofing elements of the present invention can have enhanced aesthetic matching between the appearance of the roofing substrate and an encapsulated photovoltaic element disposed thereon. Moreover, the photovoltaic elements of some embodiments of the present invention can be constructed so that their entire visible surface matches the appearance of the photovoltaic cells.

The accompanying drawings are not necessarily to scale, and sizes of various elements can be distorted for clarity.

DETAILED DESCRIPTION OF THE INVENTION

Figure 1:
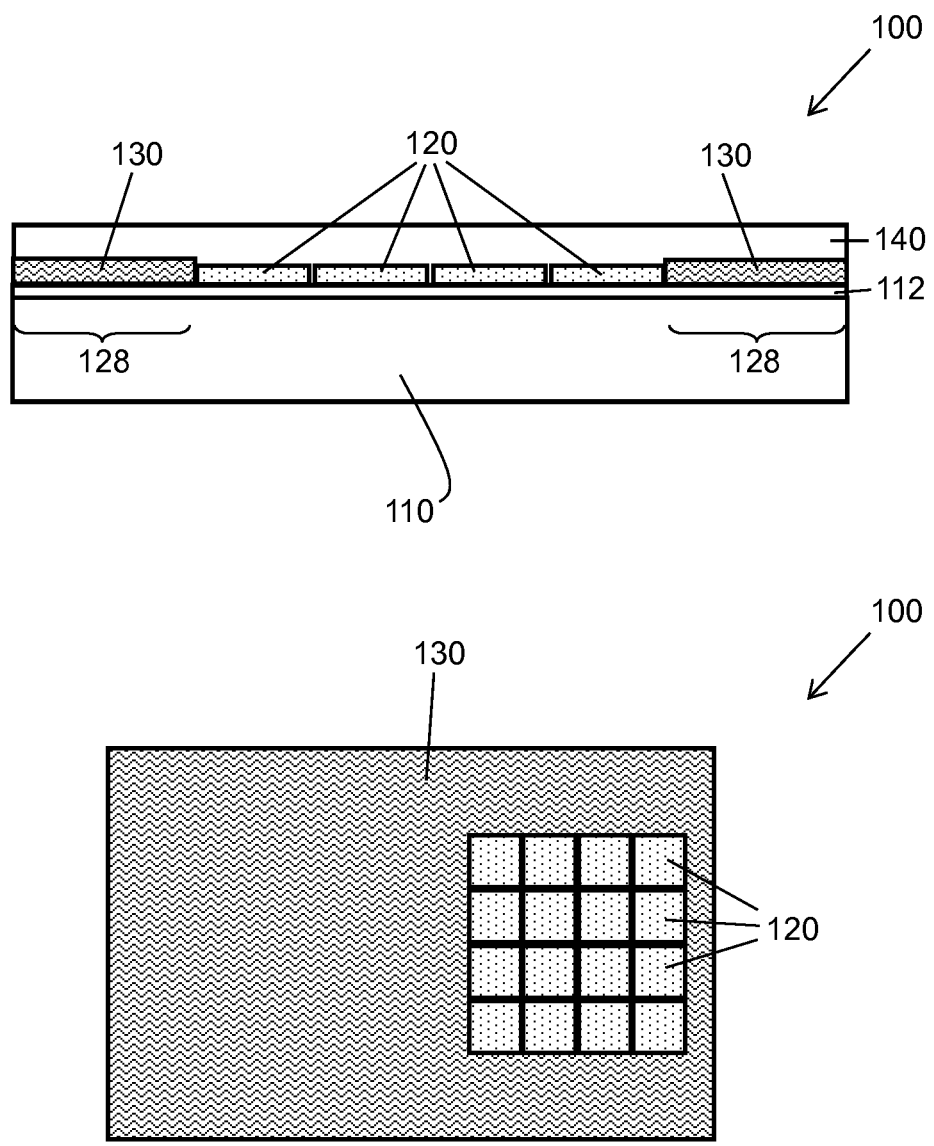
FIG. 1 is a schematic side cross-sectional view and a schematic top view of a photovoltaic roofing element according to one embodiment of the invention.

One embodiment of a photovoltaic roofing element according to the present invention is shown in schematic side cross-sectional view and schematic top view in FIG. 1. Photovoltaic roofing element 100 includes a roofing substrate 110; one or more photovoltaic cells 120 disposed on the roofing substrate 110 (e.g., through tie layer 112); a colored or patterned layer 130 disposed on the roofing substrate, and visible in the area 128 surrounding the photovoltaic cells 120; and an encapsulant layer 140 disposed over the photovoltaic cells 120 and the colored or patterned layer 130.

The photovoltaic cells can be based on any desirable photovoltaic material system, such as monocrystalline silicon; polycrystalline silicon; amorphous silicon; III-V materials such as indium gallium nitride; II-VI materials such as cadmium telluride; and more complex chalcogenides (group VI) and pnicogenides (group V) such as copper indium diselenide or CIGS. For example, one type of suitable photovoltaic cell includes an n-type silicon layer (doped with an electron donor such as phosphorus) oriented toward incident solar radiation on top of a p-type silicon layer (doped with an electron acceptor, such as boron), sandwiched between a pair of electrically-conductive electrode layers. Thin-film amorphous silicon materials can also be used, which can be provided in flexible forms. Another type of suitable photovoltaic cell is an indium phosphide-based thermo-photovoltaic cell, which has high energy conversion efficiency in the near-infrared region of the solar spectrum. Thin film photovoltaic materials and flexible photovoltaic materials can be used in the construction of encapsulated photovoltaic elements for use in the present invention. In one embodiment of the invention, the encapsulated photovoltaic element includes a monocrystalline silicon photovoltaic cell or a polycrystalline silicon photovoltaic cell. The photovoltaic cells can be interconnected to provide a single set of electrical termini.

In certain embodiments of the invention, the photovoltaic cells, the colored or patterned layer, and the encapsulant layer can be provided together as an encapsulated photovoltaic element, which can be affixed to the roofing substrate. An encapsulated photovoltaic element includes a top layer material at its top surface, and a bottom layer material at its bottom surface. The top layer material can, for example, provide environmental protection to the underlying photovoltaic cells, and any other underlying layers. Examples of suitable materials for the top layer material include fluoropolymers, for example ETFE (e.g., NORTON® EFTE film available from Saint Gobain), PFE, FEP (e.g., NORTON® FEP film available from Saint Gobain), PCTFE or PVDF. The top layer material can alternatively be, for example, a glass sheet, or a non-fluorinated polymeric material. The bottom layer material can be, for example, a fluoropolymer, for example ETFE, PFE, FEP, PVDF or PVF ("TEDLAR"). The bottom layer material can alternatively be, for example, a polymeric material (e.g., polyester such as PET); or a metallic material (e.g., steel or aluminum sheet). In certain embodiments of the invention, the bottom layer material has a surface tension no greater than about 35 dyne/cm.

Figure 2:
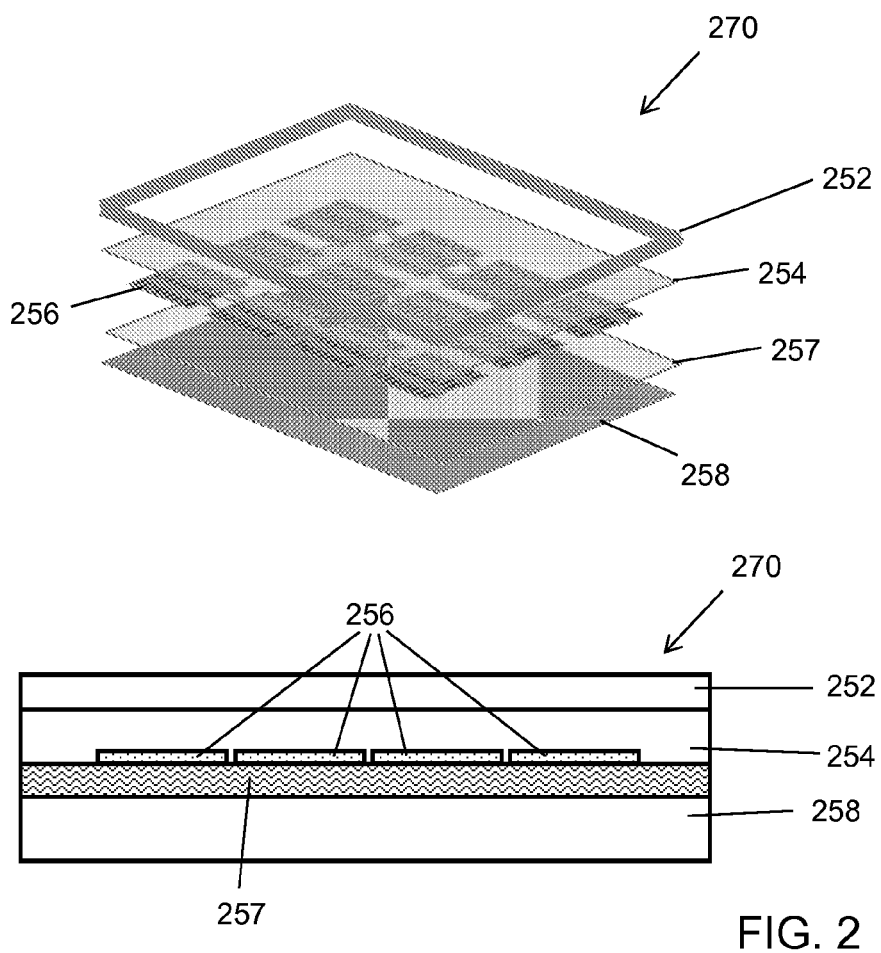
FIG. 2 is a schematic exploded perspective view and a schematic side cross-sectional view of an encapsulated photovoltaic element including a colored or patterned layer.

As the person of skill in the art will appreciate, the encapsulated photovoltaic element can include other layers interspersed between the top layer material and the bottom layer material. For example, the encapsulated photovoltaic element can include structural elements (e.g., a reinforcing layer of glass, metal or polymer fibers, or a rigid film); adhesive layers (e.g., EVA to adhere other layers together); mounting structures (e.g., clips, holes, or tabs); and one or more optionally connectorized electrical cables for electrically interconnecting the photovoltaic cell(s) of the encapsulated photovoltaic element with an electrical system. An example of an encapsulated photovoltaic element suitable for use in the present invention is shown in schematic exploded view and schematic side cross-sectional view in FIG. 2. Encapsulated photovoltaic element 270 includes a top protective layer 252 (e.g., glass or a fluoropolymer film such as ETFE, PVDF, FEP, PFA or PCTFE); adhesive layer 254 (e.g., EVA, functionalized EVA, crosslinked EVA, silicone, thermoplastic polyurethane, maleic acid-modified polyolefin, ionomer, or ethylene/(meth) acrylic acid copolymer); a layer of electrically-interconnected photovoltaic cells 256; a colored or patterned layer 257; and a backing layer 258 (e.g., PVDF, PVF, PET).

The colored or patterned layer is disposed substantially at or beneath the level of the one or more photovoltaic cells. For example, in the example shown in FIG. 2, colored or patterned layer 257 is disposed beneath the level of the one or more photovoltaic cells; in this embodiment, the colored or patterned layer extends beneath the photovoltaic cells themselves, though in other embodiments it need not do so. In other embodiments of the invention, the colored or patterned layer is disposed substantially at the level of the one or more photovoltaic cells as shown in FIG. 1. In still other embodiments of the invention, the colored or patterned layer is disposed above the layer of the photovoltaic cells and includes one or more non-patterned, non-colored regions or apertures (e.g., holes or open areas contiguous with an edge) in substantial registration with the one or more photovoltaic cells. In some embodiments of the invention, the wiring (e.g., wires or wire ribbons) interconnecting individual photovoltaic cells, and/or other electrical components can be disposed substantially beneath the colored or pattern layer, thereby hiding or masking them from view.

The encapsulated photovoltaic element can include at least one antireflection coating, for example as the top layer material, or disposed between the top layer material and the photovoltaic cells.

Suitable photovoltaic cells and/or photovoltaic elements can be obtained, for example, from China Electric Equipment Group of Nanjing, China, as well as from several domestic suppliers such as Uni-Solar, Sharp, Shell Solar, BP Solar, USFC, FirstSolar, General Electric, Schott Solar, Evergreen Solar and Global Solar. Moreover, the person of skill in the art can fabricate encapsulated photovoltaic elements using techniques such as lamination or autoclave processes. The encapsulated photovoltaic elements can be made, for example, using methods disclosed in U.S. Pat. No. 5,273,608, which is hereby incorporated herein by reference.

The top surface of a photovoltaic cell is the surface presenting its photoelectrically-active areas. When installed, the photovoltaic roofing elements of the present invention should be oriented so that the top surface of the photovoltaic cell(s) is illuminated by solar radiation.

The one or more photovoltaic cells have an operating wavelength range. Solar radiation includes light of wavelengths spanning the near UV, the visible, and the near infrared spectra. As used herein, the term "solar radiation," when used without further elaboration means radiation in the wavelength range of 300 nm to 1500 nm, inclusive. Different photovoltaic elements have different power generation efficiencies with respect to different parts of the solar spectrum. Amorphous doped silicon is most efficient at visible wavelengths, and polycrystalline doped silicon and monocrystalline doped silicon are most efficient at near-infrared wavelengths. As used herein, the operating wavelength range of an encapsulated photovoltaic element is the wavelength range over which the relative spectral response is at least 10% of the maximal spectral response. According to certain embodiments of the invention, the operating wavelength range of the photovoltaic element falls within the range of about 300 nm to about 2000 nm. In certain embodiments of the invention, the operating wavelength range of the encapsulated photovoltaic element falls within the range of about 300 nm to about 1200 nm. For example, for encapsulated photovoltaic elements having photovoltaic cells based on typical amorphous silicon materials the operating wavelength range is between about 375 nm and about 775 nm; for typical polycrystalline silicon materials the operating wavelength range is between about 600 nm and about 1050 nm; and for typical monocrystalline silicon materials the operating wavelength range is between about 425 nm and about 1175 nm.

The present invention can be practiced using any of a number of types of roofing substrates. For example, in certain embodiments of the invention, the top surface of the roofing substrate is polymeric (e.g., a polymeric material, or a polymeric coating on a metallic material). In other embodiments of the invention, the top surface of the roofing substrate is metallic. In other embodiments of the invention, the top surface of the roofing substrate is coated with roofing granules (e.g., a bituminous material coated with roofing granules). In other embodiments of the invention, the top surface of the roofing substrate is bituminous (e.g., an uncoated bituminous roofing substrate). For example, the roofing substrate can be an asphalt roofing shingle (e.g., coated with roofing granules, or uncoated by roofing granules in the area upon which photovoltaic cells are disposed). In other embodiments of the invention, the roofing substrate is polymeric. For example, the roofing substrate can be a polymeric roofing tile or a polymeric roofing panel. Suitable polymers include, for example, polyolefin, polyethylene, polypropylene, ABS, PVC, ASA, AES, polycarbonates, nylons, EPDM, fluoropolymers, silicone, rubbers, thermoplastic elastomers, polyesters, PBT, poly(meth)acrylates, epoxies, and can be filled or unfilled or formed. For example, in one embodiment of the invention the roofing substrate has polypropylene at its top surface. In other embodiments of the invention, the roofing substrate is a metal panel. The roofing substrate can be made of other materials, such as composite, ceramic, or cementitious materials.

In certain embodiments of the invention, the photovoltaic cells (e.g., supplied as an encapsulated photovoltaic element) can be joined to the roofing substrate through a tie layer, as described in the U.S. patent application Ser. No. 12/266,409, entitled "Photovoltaic Roofing Elements Including Tie Layers Systems, Roofs Using Them, and Methods for Making Them," filed on Nov. 6, 2008, as well as U.S. Provisional Patent Application Ser. No. 60/985,932, filed Nov. 6, 2007; Ser. No. 60/985,935, filed Nov. 6, 2007; and Ser. No. 60/986,556, filed Nov. 8, 2007, each of, which is hereby incorporated herein by reference in its entirety. Examples of suitable tie layers, depending on the application, include oxidized asphalt, SBS-modified asphalt, APP-modified asphalt, adhesives, polypropylene/EVA blends, pressure-sensitive adhesives, and maleic anhydride-grafted EVA, polypropylene/polyethylene copolymers, butyl adhesives, pressure sensitive adhesives, or functionalized EVA. The tie layer systems can also include a layer of fibrous material, mineral particles, roofing granules, felt, or porous web partially embedded in the material of the roofing substrate. Examples of various processes for bonding bottom layer of the encapsulated photovoltaic element to the top surface of the roofing substrate may include, for example, compression molding, injection molding, co-extrusion, lamination, ultrasonic welding, vibration welding, laser welding, and IR welding. In some embodiments of this invention, the top surface of the roofing substrate or the bottom surface of the roofing substrate or both can be surface treated to enhance their affinity to the tie layer. Examples of the surface treatments include flame treatment, plasma treatment, corona treatment, ozone treatment, sodium treatment, etching, ion implantation, electron bean treatment, or combinations thereof.

Figure 3:
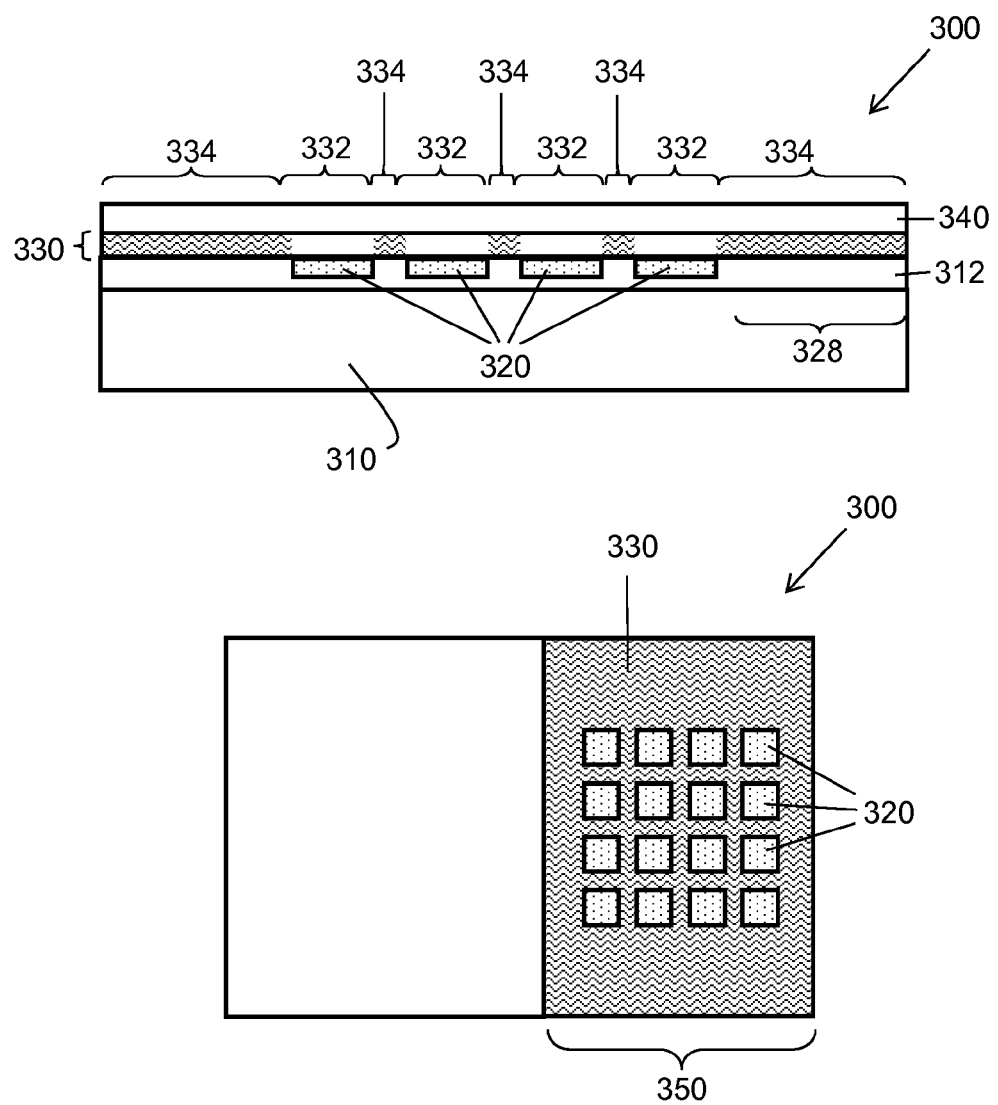
FIG. 3 is a schematic side cross-sectional view and a schematic top view of a photovoltaic roofing element according to another embodiment of the invention.

Another embodiment of the invention is shown in schematic side cross-sectional view and schematic top view in FIG. 3. Photovoltaic roofing element 300 includes a roofing substrate 310 (e.g., a polymer sheet), with one or more photovoltaic cells 320 disposed on the roofing substrate 310, and joined thereto through tie layer system 312 (e.g., a maleic anhydride-grafted EVA layer). A colored or patterned layer 330 is disposed on the roofing substrate above the level of the photovoltaic cells (e.g., adhered by an adhesive layer). Colored or patterned layer 330 has non-patterned, non-colored regions 332, and colored or patterned regions 334. The non-patterned, non-colored region 332 is in substantial registration with the one or more photovoltaic cells, so that the photovoltaic cells are fully exposed to solar illumination. Top encapsulating layer 340 overlies the colored or patterned layer 330. In this embodiment of the invention, the colored or patterned layer covers substantially the entire visible region 350 of the roofing substrate. As used herein, the "visible region" of a roofing element is the region that is visible when the roofing element is installed on a roof (i.e., not covered by overlaying courses of elements or photovoltaic cells). Accordingly, in this embodiment it is the colored or patterned layer that provides the overall appearance to the roofing substrate in the areas (e.g., 328) not covered by photovoltaic cells, and therefore the appearance of the photovoltaic roofing element does not depend strongly on the appearance of the roofing substrate. As described above, the colored or patterned layer can be selected so that the photovoltaic roofing element is made to appear like a conventional roofing material. Alternatively, the colored or patterned layer can be selected to match the appearance of the photovoltaic cells, so that the entire surface of the photovoltaic roofing element looks relatively uniform, or to have any other desired aesthetic effect.

Figure 4:
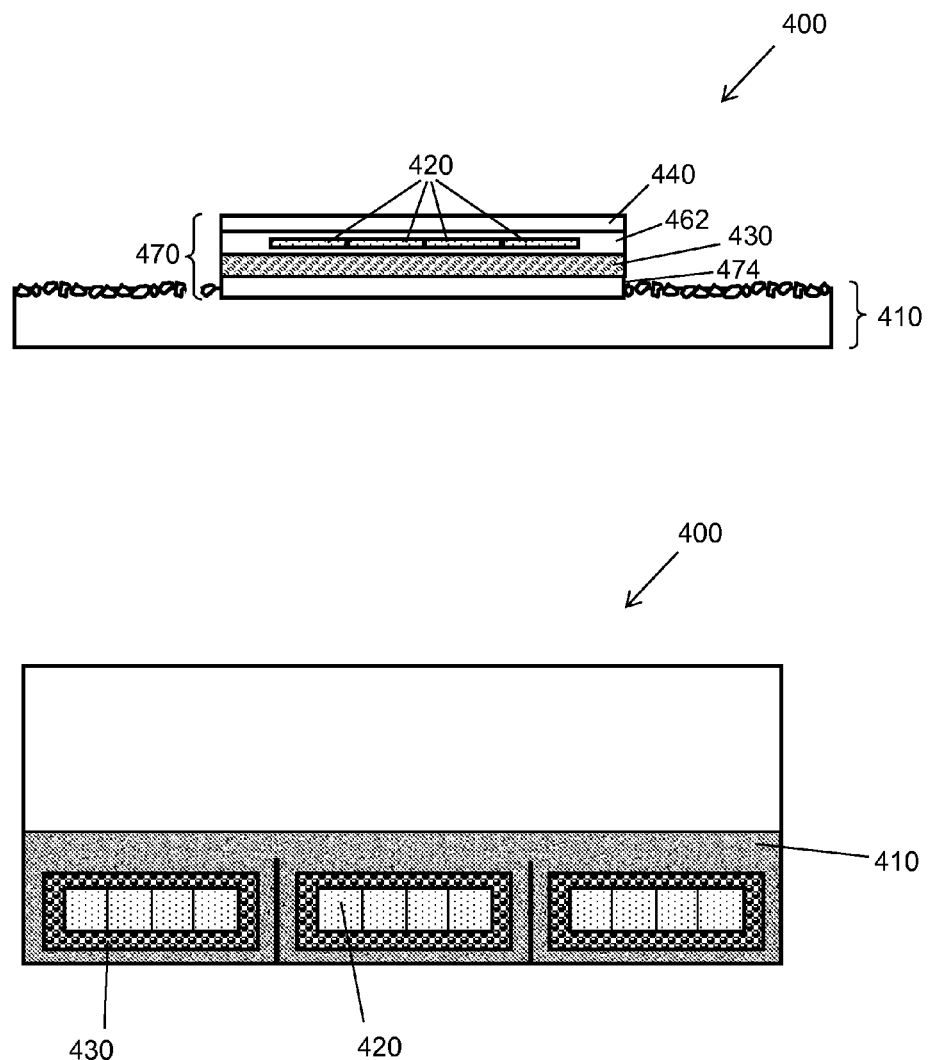
FIG. 4 is a schematic side cross-sectional view and a schematic top view of a photovoltaic roofing element according to another embodiment of the invention.

Another embodiment of the invention is shown in schematic side cross-sectional view and schematic top view in FIG. 4. Photovoltaic roofing element 400 includes a roofing substrate 410 (e.g., a granule-coated asphalt shingle), with an encapsulated photovoltaic element 470 disposed thereon. Encapsulated photovoltaic element 470 includes (from top to bottom) a top encapsulant layer 440 (e.g., a fluoropolymer); an adhesive layer 462 (e.g., EVA); photovoltaic cells 420 embedded in adhesive material 462; a colored or patterned layer 430; and a bottom backing layer 474. In this embodiment of the invention, the colored or patterned layer is part of an encapsulated photovoltaic element, and does not extend all the way out to the edges of the visible region of the roofing substrate. The colored or patterned layer can provide a desired appearance to the regions of the encapsulated photovoltaic element that do not present the photovoltaic cells. In such embodiments of the invention, the bottom backing layer can be chosen for its physical properties, such as mechanical and/or electrical properties, without regard to its appearance. The bottom backing layer can be, for example, a fluoropolymer, for example ETFE ("TEFZEL"), PFE, FEP, PVDF or PVF ("TEDLAR"), a polymeric material (e.g., polyester such as PET), or a metallic material (e.g., steel or aluminum sheet. For example, the colored or patterned layer can be selected to match the appearance of the roofing substrate. In one embodiment of the invention, the roofing substrate is a granule-coated asphalt shingle, and the colored or patterned layer is designed to match the appearance of the granule-coated shingle.

In certain embodiments of the invention, the colored or patterned layer is colored. As used herein, an item that is "colored" is one that appears colored (including white, black or grey, but not colorless) to a human observer. According to one embodiment of the invention, the colored or patterned layer includes (either at one of its surfaces or within it) a near infrared transmissive multilayer interference coating designed to reflect radiation within a desired portion of the visible spectrum. In another embodiment of the invention, the colored or patterned layer includes (either at one of its surfaces or within it) one or more colorants (e.g., dyes or pigments). The colored or patterned layer can also be patterned, in which one or more colors are varied over the area of the layer, for example randomly or in some preselected arrangement. The color(s) and pattern(s) can be selected so that the layer has an appearance that matches, harmonizes with and/or complements a desired type of roofing material, such as asphalt shingles of a given color and design. The pattern of colorant can be, for example, uniform, or can be mottled in appearance. Ink jet printing, digital image printing, laser printing, gravure printing, roll printing, spraying, lithography, or any other suitable printing or coating processes can be used to form the colored or patterned layers for use in the present invention. In some embodiments, a high resolution graphic printing method is employed to replicate the appearance of the surrounding roofing substrate, or alternatively, the appearance of the photovoltaic element itself. For example, the colored or patterned layer can approximate the appearance of the roofing materials to be used in conjunction with the photovoltaic device (e.g., granule-coated asphalt shingles). Photovoltaic devices made with colored or patterned polymer structures are described in further detail in U.S. patent application Ser. No. 11/456,200, filed on Jul. 8, 2006 and entitled "Photovoltaic Device" (published as US 2008/0006323 A1 on Jan. 10, 2008), which is hereby incorporated herein by reference in its entirety.

A number of techniques can be used to provide the colored or patterned layer. For example, U.S. Pat. Nos. 5,203,941, 5,284,693, 5,506,031 and 5,662,977, each of which is hereby incorporated by reference herein in its entirety, disclose printed decorative layers disposed beneath a weatherable protective coating. U.S. Pat. No. 6,296,732, which is hereby incorporated herein by reference in its entirety, discloses an extrusion process for print and color coats suitable for imparting decorative aspects to exterior products. U.S. Pat. No. 5,468,532, which is hereby incorporated herein by reference in its entirety, discloses a multilayer article having a graphic layer disposed between a substrate and a protective layer. U.S. Pat. No. 6,180,228, which is hereby incorporated herein by reference in its entirety, discloses a weatherable system having an image layer with a protective layer laminated thereto. U.S. Pat. No. 6,753,065 and U.S. Patent Application Publication no. 2007/0059493, each of which is hereby incorporated herein by reference in its entirety, disclose light-transmissive slip-resistant protective layers for protecting graphic-printed films. U.S. Pat. No. 7,138,173, which is hereby incorporated herein by reference in its entirety, discloses optical films that change color as a function of viewing angle. U.S. patent application Ser. No. 11/456,200, which is hereby incorporated herein by reference in its entirety, discloses decorative overlays positioned over photovoltaic elements.

The colored or patterned layer can be patterned and colored to resemble a natural roofing material such wood, slate or stone, or other manmade materials such as ceramic or concrete. For example, in one embodiment of the invention, a graphic print reproducing a natural slate material (i.e., having shading and variegation emulating the natural texture and appearance of slate) is applied to a polymer film to provide the colored or patterned layer. Of course, the colored or patterned layer could be selected to have any desired pattern and/or color, and need not look like traditional roofing materials. In certain embodiments of the invention, the colored or patterned layer is selected to match the appearance of the roofing element upon which the cells are disposed, and/or the appearance of adjacent roofing elements.

In certain embodiments of the invention, the $\Delta E^*$ between the colored or patterned layer and the roofing substrate is less than 30, or even less than 20. As used herein $L^*$, $a^*$ and $b^*$ are the color measurements for a given sample using the 1976 CIE color space. $L^*$, $a^*$ and $b^*$ values are measured using a HunterLab Model Labscan XE spectrophotometer using a 0° viewing angle, a 45° illumination angle, a 10° standard observer, and a D-65 illuminant. Lower $L^*$ values correspond to relatively darker tones. The strength in color space $E^*$ is defined as $E^*=(L^{*2}+a^{*2}+b^{*2})^{1/2}$. The total color difference $\Delta E$ between two articles is defined as $\Delta E^*=(\Delta L^{*2}+\Delta a^{*2}+\Delta b^{*2})^{1/2}$, in which $\Delta L^*$, $\Delta a^*$ and $\Delta b^*$ are respectively the differences in $L^*$, $a^*$ and $b^*$ for the two articles.

The colors(s) and patterns(s) can alternatively be selected to match, harmonize with and/or complement the appearance of the one or more photovoltaic cells. For example, the colored or patterned layer can have an average color having CIE coordinates $L^*$ in the range of about 20 to about 30, $a^*$ in the range of about −5 to about 5, and $b^*$ in the range of −15 to about −5; such granules can provide increased color matching with photovoltaic materials. In certain embodiments of the invention, the $\Delta E^*$ between the colored or patterned layer and the photovoltaic cells is less than 30, or even less than 20.

In certain embodiments of the invention, the colored or patterned layer comprises a pearlescent pigment, a nacreous pigment, a metal flake pigment or an encapsulated metal flake pigment. For example, light-interference platelet pigments are known to give rise to various optical effects when incorporated in coatings, including opalescence or "pearlescence." Examples of light-interference platelet pigments that can be employed in the granules of the present invention include pigments available from Wenzhou Pearlescent Pigments Co., Ltd., No. 9 Small East District, Wenzhou Economical and Technical Development Zone, Peoples Republic of China, such as Taizhu TZ5013 (mica, rutile titanium dioxide and iron oxide, golden color), TZ5012 (mica, rutile titanium dioxide and iron oxide, golden color), TZ4013 (mica and iron oxide, wine red color), TZ4012 (mica and iron oxide, red brown color), TZ4011 (mica and iron oxide, bronze color), TZ2015 (mica and rutile titanium dioxide, interference green color), TZ2014 (mica and rutile titanium dioxide, interference blue color), TZ2013 (mica and rutile titanium dioxide, interference violet color), TZ2012 (mica and rutile titanium dioxide, interference red color), TZ2011 (mica and rutile titanium dioxide, interference golden color), TZ1222 (mica and rutile titanium dioxide, silver white color), TZ1004 (mica and anatase titanium dioxide, silver white color), TZ4001/600 (mica and iron oxide, bronze appearance), TZ5003/600 (mica, titanium oxide and iron oxide, gold appearance), TZ1001/80 (mica and titanium dioxide, off-white appearance), TZ2001/600 (mica, titanium dioxide, tin oxide, off-white/gold appearance), TZ2004/600 (mica, titanium dioxide, tin oxide, off-white/blue appearance), TZ2005/600 (mica, titanium dioxide, tin oxide, off-white/green appearance), and TZ4002/600 (mica and iron oxide, bronze appearance). Examples of light-interference platelet pigments that can be employed in the present invention also include pigments available from Merck KGaA, Darmstadt, Germany, such as Iriodin® pearlescent pigment based on mica covered with a thin layer of titanium dioxide and/or iron oxide; Xirallic™ high chroma crystal effect pigment based upon $Al_2O_3$ platelets coated with metal oxides, including Xirallic T 60-10 WNT crystal silver, Xirallic™ T 60-20 WNT sunbeam gold, and Xirallic™ F 60-50 WNT fireside copper; Color Stream™ multi color effect pigments based on $SiO_2$ platelets coated with metal oxides, including Color Stream F 20-00 WNT autumn mystery and Color Stream F 20-07 WNT viola fantasy; and ultra interference pigments based on $TiO_2$ and mica.

Examples of mirrorized silica pigments that can be employed in the present invention include pigments such as Chrom Brite™ CB4500, available from Bead Brite, 400 Oser Ave, Suite 600, Hauppauge, N.Y. 11788.

In certain embodiments of the invention, the colored or patterned layer includes a birefringent multilayer optical film having an angularly-dependent appearance. The color-shift effect of such films can be further modified by adjusting the reflectance or absorbance behavior of the layer beneath the birefringent optical film.

In certain embodiments of the invention, the colored or patterned layer can include a colored, infrared-reflective pigment, for example comprising a solid solution including iron oxide, such as disclosed in U.S. Pat. No. 6,174,360, which is hereby incorporated herein by reference in its entirety; or a near infrared-reflecting composite pigment such as disclosed in U.S. Pat. No. 6,521,038, which is hereby incorporated herein by reference in its entirety. Composite pigments are composed of a near-infrared non-absorbing colorant of a chromatic or black color and a white pigment coated with the near infrared-absorbing colorant. Near-infrared non-absorbing colorants that can be used in the present invention include organic pigments such as organic pigments including azo, anthraquinone, phthalocyanine, perinone/perylene, indigo/thioindigo, dioxazine, quinacridone, isoindolinone, isoindoline, diketopyrrolopyrrole, azomethine, and azomethine-azo functional groups. Preferred black organic pigments include organic pigments having azo, azomethine, and perylene functional groups. Colored, infrared-reflective pigments can be present, for example, at a level in the range of about 0.5 percent by weight to about 40 percent by weight of the base layer composition. Preferably, such a coating composition forms a layer having sufficient thickness to provide good hiding and opacity, such as a thickness of from about 5 μm to about 50 μm.

Examples of near IR-reflective pigments available from the Shepherd Color Company, Cincinnati, Ohio, include Arctic Black 10C909 (chromium green-black), Black 411 (chromium iron oxide), Brown 12 (zinc iron chromite), Brown 8 (iron titanium brown spinel), and Yellow 193 (chrome antimony titanium).

In certain embodiments of the invention, the colored or patterned layer includes at least one coloring material selected from the group consisting of coloring pigments and UV-stabilized dyes. Suitable coloring pigments include transition metal oxides.

Conventional pigments that can be used include those provided by the Color Division of Ferro Corporation, 4150 East 56th St., Cleveland, Ohio 44101, and produced using high temperature calcinations, including PC-9415 Yellow, PC-9416 Yellow, PC-9158 Autumn Gold, PC-9189 Bright Golden Yellow, V-9186 Iron-Free Chestnut Brown, V-780 Black, V0797 IR Black, V-9248 Blue, PC-9250 Bright Blue, PC-5686 Turquoise, V-13810 Red, V-12600 Camouflage Green, V12560 IR Green, V-778 IR Black, and V-799 Black. Further examples of pigments that can be used include white titanium dioxide pigments provided by Du Pont de Nemours, P.O. Box 8070, Wilmington, Del. 19880.

In one embodiment of the invention, the colored or patterned layer comprises a first layer having a reflectivity of at least 0.25 for near-IR radiation (i.e., 700-2500 $cm^{-1}$); and a second layer disposed on the first layer, the second layer reflecting colored light but being substantially transparent to near-IR radiation (e.g., at least 85% overall energy transmittance). Such materials are described, for example, in U.S. patent applications Ser. Nos. 11/588,577 and 12/266,481, each of which is hereby incorporated herein by reference in its entirety. The layers can be polymer layers, and can be co-extruded. The first layer can comprise a first polymer and can be substantially near-IR reflective. The first layer can, for example, include a white reflective pigment such as titanium dioxide, zinc oxide or zinc sulfide. The second layer can comprise a second polymer and be substantially near-IR transmissive. The second layer can have, for example, a thickness in the range of from about 0.5 mil to about 10 mil. The use of such layers can provide the photovoltaic element with a measure of heat reflectance, and thereby reduce the average temperature of the roof, which can help the photovoltaic cells operate at higher efficiencies.

The first layer can have a first coloration, and the second layer can have a second coloration different from the first coloration. In some embodiments of the invention, the second coloration substantially obscures the first coloration. The second layer can include, for example, the infrared-reflecting pigments described above. In some embodiments of the invention, the second layer includes one or more additional or alternative pigments such as pearlescent pigments, light-interference platelet pigments, ultramarine blue, ultramarine purple, cobalt chromite blue, cobalt aluminum blue, chrome titanate, nickel titanate, cadmium sulfide yellow, cadmium sulfide yellow, cadmium sulfoselenide orange, and organic pigments such as perylene black, phthalo blue, phthalo green, quinacridone red, diarylide yellow, azo red, and dioxazine purple. Additional pigments may comprise iron oxide pigments, titanium oxide pigments, composite oxide system pigments, titanium oxide-coated mica pigments, iron oxide-coated mica pigments, scaly aluminum pigments, zinc oxide pigments, copper phthalocyanine pigment, dissimilar metal (nickel, cobalt, iron, or the like) phthalocyanine pigment, non-metallic phthalocyanine pigment, chlorinated phthalocyanine pigment, chlorinated-brominated phthalocyanine pigment, brominated phthalocyanine pigment, anthraquinone, quinacridone system pigment, diketo-pyrrolipyrrole system pigment, perylene system pigment, monoazo system pigment, diazo system pigment, condensed azo system pigment, metal complex system pigment, quinophthalone system pigment, Indanthrene Blue pigment, dioxadene violet pigment, anthraquinone pigment, metal complex pigment, benzimidazolone system pigment, and the like.

Photovoltaic cells often have a somewhat metallic appearance, and sometimes have a color effect known as "flop," depending on the viewing angle and the illumination angle. To achieve better matching of appearance between the photovoltaic elements and the roofing substrate upon which they are disposed, in certain embodiments of the invention the colored or patterned layer can have a multi-layer structure. The first layer can be, for example, the main color tone that approximates the characteristic dark blue color of a photovoltaic element. The second layer (disposed on the first) can be added to provide the metallic effect and optionally tune the color of the first coating, for example with pigments such as platelet or effect pigments.

In certain embodiments of the invention, the colored or patterned layer has a metallic or light-interference effect. Such an effect can help impart a metallic visual effect to the colored or patterned layer, so as to better mimic the metallic effect appearance of many photovoltaic cells. For example, the colored or patterned layer can include one or more colorants such as a pearlescent pigment, a lamellar pigment, a light-interference pigment, a metallic pigment, an encapsulated metallic pigment, a passivated metal pigment, or metallic powder. In one embodiment of the invention, a layer having a metallic or light-interference effect is disposed on a layer having a white reflective pigment (e.g., $TiO_2$ or $ZnO_2$). This can increase the efficiency of the metallic/light-interference pigments by increasing scattering from the background. In some embodiments, the one or more colorants can themselves have a multilayer structure, such that thin film interference effects give rise to metallic appearance effects or angular metamerism.

The photovoltaic roofing elements of the present invention can have other features. For example, additional surfacing media such as silica granules or polymer granules with high transmittance to solar radiation can be disposed on the top surface of the photovoltaic element to provide a textured surface or added aesthetic value, such as described in U.S. patent application Ser. No. 11/742,909, which is hereby incorporated herein by reference in its entirety. The photovoltaic roofing elements can also include a colored and/or patterned layer, for example to tune the appearance and/or to provide a masking effect to the photovoltaic cells themselves. The colors and/or patterns can be created using, for example, optical interference, stacks of dielectric layers, special bandwidth-transmissive pigments, nanometallic particles (e.g., Cermet Film available from Saint-Gobain Corp.), or quantum dot technology. Colored or patterned layers disposed over the photovoltaic cells are described, for example, in U.S. patent application Ser. No. 12/145,166, which is hereby incorporated herein by reference in its entirety.

One or more of the photovoltaic roofing elements described above can be installed on a roof as part of a photovoltaic system for the generation of electric power. Accordingly, one embodiment of the invention is a photovoltaic roofing system disposed on a roof deck, comprising one or more photovoltaic roofing elements as described above disposed on the roof deck. The photovoltaic elements of the photovoltaic roofing elements are desirably connected to an electrical system, either in series, in parallel, or in series-parallel, as would be recognized by the skilled artisan. There can be one or more layers of material, such as underlayment, between the roof deck and the photovoltaic roofing elements of the present invention. The photovoltaic roofing elements of the present invention can be installed on top of an existing roof; in such embodiments, there would be one or more layers of standard (i.e., non-photovoltaic) roofing elements (e.g., asphalt coated shingles) between the roof deck and the photovoltaic roofing elements of the present invention. Electrical connections are desirably made using cables, connectors and methods that meet UNDERWRITERS LABORATORIES and NATIONAL ELECTRICAL CODE standards. Even when the photovoltaic roofing elements of the present invention are not installed on top of preexisting roofing materials, the roof can also include one or more standard roofing elements, for example to provide weather protection at the edges of the roof, or in any hips, valleys, and ridges of the roof.

Photovoltaic roofing elements of the present invention can be fabricated using many techniques familiar to the skilled artisan. Roofing substrates can be made using a variety of techniques. For example, when the roofing substrate is an asphalt shingle or an asphalt non-woven glass reinforced laminate, the person of skill in the art can use methods described in U.S. Pat. Nos. 5,953,877; 6,237,288; 6,355,132; 6,467,235; 6,523,316; 6,679,308; 6,715,252; 7,118,794; U.S. Patent Application Publication 2006/0029775; and International Patent Application Publication WO 2006/121433, each of which is hereby incorporated herein by reference in its entirety. Photovoltaic roofing elements can be fabricated in a continuous process and then cut into individual elements as is done in the fabrication of asphalt shingles. When a continuous process is used, it can be necessary to individually prepare any electrical cables running between elements, for example by cutting the cables between elements and connectorizing the cut ends. When the roofing substrate is a polymeric tile, shake or panel, the person of skill in the art can use methods such as those described in U.S. patent application Ser. No. 12/146,986, which is hereby incorporated herein by reference. Techniques such as vacuum lamination, coextrusion, coating, compression molding or adhesive techniques can be used to include the colored or patterned layer in the photovoltaic roofing element.

Figure 5:
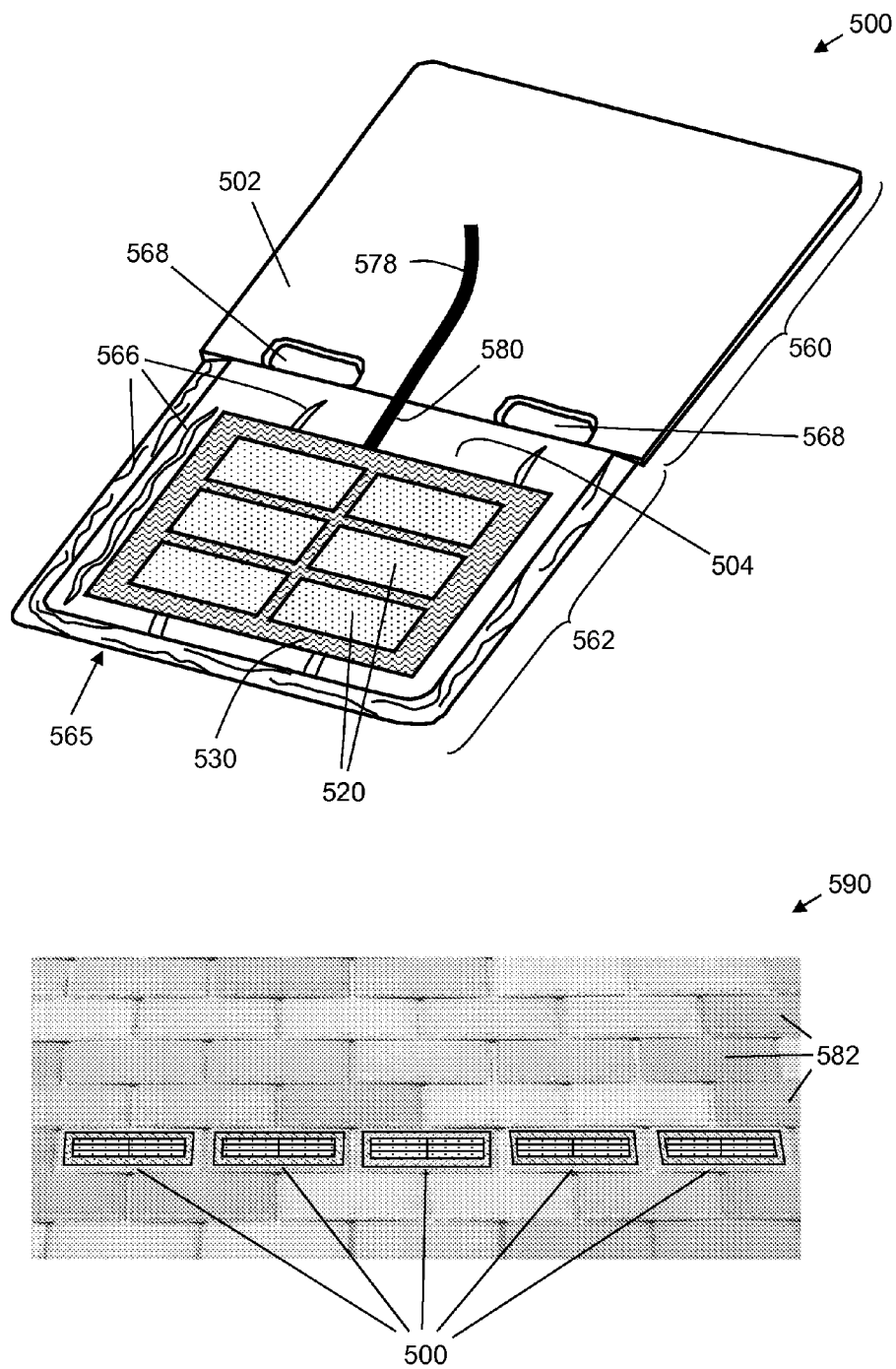
FIG. 5 is a schematic top perspective view of a photovoltaic roofing element according to one embodiment of the invention, and a top view of a roof comprising such photovoltaic roofing elements.

FIG. 5 shows a photovoltaic roofing system according to this aspect of the invention, in which a plurality of photovoltaic roofing elements 500 is disposed on a roof deck along with a plurality of standard roofing elements. Photovoltaic roofing element 500 is a photovoltaic roofing tile having a headlap portion 560 and a butt portion 562. The photovoltaic cells 520 and colored or patterned layer 530 are disposed on polymeric carrier tile 502 in its butt portion 562. In certain embodiments of the invention, and as shown in FIG. 5, the butt portion 562 of the polymeric carrier tile 502 has features 566 molded into its surface, in order to provide a desired appearance to the polymeric carrier tile. In the embodiment shown in FIG. 5, the polymeric carrier tile 502 has a pair of recessed nailing areas 568 formed in its headlap portion 560, for example as described in International Patent Application Publication no. WO 08/052029, which is hereby incorporated herein by reference in its entirety. In certain embodiments of the invention, and as shown in FIG. 5, the photovoltaic cells 520 have coupled to them at least one electrical lead 578. The electrical lead can be disposed in a channel 580 formed in the top surface 504 of the polymeric carrier tile 502. The U-shaped periphery along the right and left sides and lower edge of the butt portion 562 slopes downwardly from its top surface to its bottom surface, as shown at 565. Examples of these photovoltaic roofing elements are described in more detail in U.S. patent application Ser. No. 12/146,986, which is hereby incorporated herein by reference in its entirety.

In one embodiment of the invention, the photovoltaic roofing system further includes a plurality of non-photovoltaic roofing elements disposed on the roof deck. FIG. 5 also shows a roof 590 comprising five photovoltaic roofing elements 500 and a plurality of non-photovoltaic roofing elements (in this example, polymeric roofing tiles) 582. The electrical leads 578 (not shown) are interconnected into an electrical system to collect the electrical energy generated by the photovoltaic roofing elements 500.

In certain embodiments of the invention, the colored or patterned layers of the photovoltaic roofing elements are patterned and/or colored to resemble (e.g., patterned and/or colored substantially the same as) the non-photovoltaic roofing elements. For example, if the non-photovoltaic roofing elements are granule-coated asphalt shingles, the colored or patterned layers can be patterned and colored to appear substantially the same as the granule-coated asphalt surface. As described above, if the non-photovoltaic roofing elements are formed from slate (or formed to appear like slate), the colored or patterned layers can be patterned and colored with a slate-like appearance.

In one embodiment of the invention, the non-photovoltaic roofing elements comprise a colored or patterned layer as described above. The colored or patterned layers of the non-photovoltaic roofing elements can be, for example, colored or patterned layer substantially the same as those of the photovoltaic roofing elements. For example, the ΔE* between the colored or patterned layer of the photovoltaic roofing element and the non-photovoltaic roofing elements can be less than 30, or even less than 20. In one embodiment of the invention, the colored or patterned layers of both the non-photovoltaic roofing elements and the photovoltaic roofing elements are colored and/or patterned to resemble (e.g., colored and/or patterned substantially the same as) the photovoltaic cells, in order to provide a roof with a uniform appearance.

Another aspect of the invention is a photovoltaic element, the photovoltaic element comprising a backing layer; one or more photovoltaic cells disposed on the backing layer; a colored or patterned layer disposed on the backing layer and visible in the area surrounding the photovoltaic cells; and an encapsulant layer disposed over the photovoltaic cells and the patterned colored layer. One example of such a photovoltaic element is described above with respect to FIG. 2. Such a photovoltaic element can be used to match the non-photovoltaically-active areas of a photovoltaic element to a desired surface; or to provide a photovoltaic element with a substantially uniform appearance, as described above. In certain embodiments of the invention, the ΔE* between the colored or patterned layer and the photovoltaic cells is less than 30, or even less than 20.

Another aspect of the invention is a method for installing photovoltaic cells on a surface, the method comprising selecting a colored or patterned layer that resembles the surface (for example, as described above), and disposing the photovoltaic cells and the colored or patterned layer on the surface, such that the photovoltaic cells are visible, and the colored or patterned layer is visible in the area surrounding the photovoltaic cells; and the surface is visible in an area adjacent the colored or patterned layer. The photovoltaic cells and the colored or patterned layer can be provided as a photovoltaic element comprising a backing layer; one or more photovoltaic cells disposed on the backing layer; a colored or patterned layer disposed on the backing layer and visible in the area surrounding the photovoltaic cells; and an encapsulant layer disposed over the photovoltaic cells and the patterned colored layer, as described above. For example, in certain embodiments of the invention, the ΔE* between the colored or patterned layer and the surface is less than 30, or even less than 20. In this aspect of the invention, the colored or patterned layer can be used to hide any wiring or other electronics from view, while providing a uniform appearance to areas of the surface that do not have the photovoltaic cells themselves disposed thereon.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:

1. A photovoltaic roofing element comprising
   a roofing substrate having a visible region having a down-roof edge and two lateral edges;
   an encapsulated photovoltaic element having a top surface, the encapsulated photovoltaic element comprising:
      a backing layer,
      a colored or patterned film disposed on top of the backing layer;
      one or more photovoltaic cells disposed on top of the colored or patterned film, each photovoltaic cell having a photovoltaically-active surface, each of the one or more photovoltaic cells comprising two electrically-conductive electrode layers with a photovoltaic material disposed between them; and
      an encapsulant layer disposed over the photovoltaic cells and the colored or patterned film;
      wherein the colored or patterned film is visible in the area surrounding the one or more photovoltaic cells, and
   the encapsulated photovoltaic element being disposed on top of the visible region of the roofing substrate such that the backing layer is disposed between the colored or patterned film and the roofing substrate, and the one or more photovoltaic cells are disposed between the encapsulant later and the backing layer, such that the photovoltaically-active surfaces of the photovoltaic cells face the top surface of the encapsulated photovoltaic element, the encapsulated photovoltaic element not extending to the edges of the visible region of the roofing substrate.

2. The photovoltaic roofing element according to claim 1, wherein the colored or patterned film is patterned and colored to resemble wood, slate, tile, or stone.

3. The photovoltaic roofing element according to claim 1, wherein the colored or patterned film is patterned and colored to resemble a granule-coated asphalt shingle.

4. The photovoltaic roofing element according to claim 1, wherein the colored or patterned film is patterned and colored to resemble the appearance of the photovoltaic cells.

5. The photovoltaic roofing element according to claim 4, wherein the colored or patterned film comprises pearlescent pigment, a nacreous pigment, a metal flake pigment or an encapsulated metal flake pigment.

6. The photovoltaic roofing element according to claim 4, wherein the patterned film includes a birefringent multilayer optical film having an appearance that depends on viewing angle.

7. The photovoltaic roofing element of claim 1, wherein the colored or patterned film and the one or more photovoltaic cells have a ΔE* between them that is less than 20, and wherein the one or more photovoltaic cells have an L* in the range of 20 to 30, an a* in the range of −5 to 5, and a b* in the range of −15 to −5.

8. The photovoltaic roofing element of claim 1, wherein the colored or patterned film comprises a graphic print applied to a polymer film.

9. A photovoltaic roofing system disposed on a roof deck, the photovoltaic roofing system comprising
   a plurality of photovoltaic roofing elements according to claim 1 disposed on the roof deck.

10. The photovoltaic roofing system of claim 9, further comprising a plurality of non-photovoltaic roofing elements disposed on the roof deck.

11. The photovoltaic roofing system of claim 10, wherein the colored or patterned film of the photovoltaic roofing element and the non-photovoltaic roofing elements have a ΔE* between them that is less than 20.

12. A photovoltaic element having a top surface, the photovoltaic element comprising:
   a backing layer formed from ETFE, PFE, FEP, PVDF, PVF, PET, steel sheet or aluminum sheet,
   a colored or patterned film disposed on top of the backing layer;
   one or more photovoltaic cells disposed on top of the colored or patterned film, each of the one or more photovoltaic cells comprising two electrically-conductive electrode layers with a photovoltaic material disposed between them, each of the photovoltaic cells having a photovoltaically-active surface; and
   an encapsulant layer disposed over the one or more photovoltaic cells and the colored or patterned film;
   such that the one or more photovoltaic cells are disposed between the encapsulant layer and the backing layer, the colored or patterned film is disposed between the backing film and the photovoltaic cells, and the photovoltaically-active surfaces of the photovoltaic cells face the top surface of the photovoltaic element,
   wherein the colored or patterned film is visible in the area surrounding the one or more photovoltaic cells.

13. The photovoltaic element of claim 12, wherein the colored or patterned film of the photovoltaic element and the photovoltaic cells have a ΔE* between them that is less than 20, and wherein the one or more photovoltaic cells have an L* in the range of 20 to 30, an a* in the range of −5 to 5, and a b* in the range of −15 to −5.

14. The photovoltaic roofing element of claim 12, wherein the colored or patterned film comprises a graphic print applied to a polymer film.

15. A method of installing a photovoltaic roofing system on a surface, the method comprising:

disposing a plurality of photovoltaic elements according to claim 12 on the surface.

16. The method of claim 15, wherein the colored or patterned film of the photovoltaic element and the surface have a ΔE* between them of less than 30.

17. The method of claim 15, wherein plurality of photovoltaic elements are disposed on one or more roofing substrates.

18. The photovoltaic roofing element of claim 1, wherein the one or more photovoltaic cells of the encapsulated roofing element comprise a plurality of photovoltaic cells, and wherein the photovoltaic roofing element further comprises wiring interconnecting the photovoltaic cells, the wiring being disposed substantially beneath the colored or patterned layer.

19. The photovoltaic roofing element of claim 1, wherein the roofing substrate is an asphalt shingle, and wherein the roofing substrate is not coated by roofing granules in the portion of the visible region in which the encapsulated roofing element is disposed, and is coated by roofing granules in the portion of the visible region in which the encapsulated roofing element is not disposed.

20. The photovoltaic roofing system of claim 10, wherein in each photovoltaic roofing element, the patterned film and the one or more photovoltaic cells have a ΔE* between them that is less than 30, and wherein the one or more photovoltaic cells have an L* in the range of 20 to 30, an a* in the range of −5 to 5, and a b* in the range of −15 to −5.

21. A photovoltaic roofing element comprising
a roofing substrate having a top surface;
an encapsulated photovoltaic element having a top surface, the encapsulated photovoltaic element being disposed on the top surface of the roofing substrate, the encapsulated photovoltaic element comprising:
a backing layer,
a colored or patterned film disposed on top of the backing layer;
one or more photovoltaic cells disposed on top of the backing layer, each photovoltaic cell having a photovoltaically-active surface, each of the one or more photovoltaic cells comprising two electrically-conductive electrode layers with a photovoltaic material disposed between them; and
an encapsulant layer disposed over the photovoltaic cells and the colored or patterned film;
such that the one or more photovoltaic cells and the colored or patterned film are disposed between the encapsulant layer and the backing layer, and the photovoltaically-active surfaces of the photovoltaic cells face the to surface of the photovoltaic element,
wherein the colored or patterned film is visible in the area surrounding the one or more photovoltaic cells, and wherein the colored or patterned film is disposed at the level of the one or more photovoltaic cells, and wherein the colored or patterned film and the roofing substrate have a ΔE* between them that is less than 20.

22. The photovoltaic roofing element according to claim 21, wherein the roofing substrate has a visible region having a down-roof edge and two lateral edges; and wherein the photovoltaic element is disposed on the visible region of the roofing substrate, the encapsulated roofing element not extending to the edges of the visible region of the roofing substrate.

* * * * *